United States Patent [19]
Onishi

[11] Patent Number: 5,285,085
[45] Date of Patent: Feb. 8, 1994

[54] PHOTO-COUPLING DEVICE WITH IMPROVED LIGHT SHADING PLATE HOLDING MEANS

[75] Inventor: Minoru Onishi, Nara, Japan

[73] Assignee: Sharp Kabushiki Kaisha, Osaka, Japan

[21] Appl. No.: 851,658

[22] Filed: Mar. 16, 1992

[30] Foreign Application Priority Data

Oct. 5, 1990 [JP] Japan ............ 2-105449[U]
Mar. 19, 1991 [JP] Japan ............ 3-16310[U]
Aug. 30, 1991 [JP] Japan ............ 3-69524[U]

[51] Int. Cl.⁵ .................. H01L 31/12; H01L 31/16
[52] U.S. Cl. .................. 257/82; 257/98; 257/99; 257/434; 257/435
[58] Field of Search .......... 257/80, 81, 82, 98, 257/99, 432, 433, 434, 435

[56] References Cited

U.S. PATENT DOCUMENTS

5,171,985 12/1992 Kawaguchi ............ 257/80

FOREIGN PATENT DOCUMENTS

| | | | |
|---|---|---|---|
| 59-18684 | 1/1984 | Japan | 257/82 |
| 61-53786 | 3/1986 | Japan | 257/82 |
| 61-154186 | 7/1986 | Japan | 257/82 |
| 61-220483 | 9/1986 | Japan | 257/82 |
| 61-276381 | 12/1986 | Japan | 257/82 |
| 62-78887 | 4/1987 | Japan | 257/82 |
| 2-72681 | 3/1990 | Japan | 257/82 |
| 2-105473 | 4/1990 | Japan | 257/82 |
| 2-125669 | 5/1990 | Japan | 257/82 |
| 2-161782 | 6/1990 | Japan | 257/82 |

*Primary Examiner*—William Mintel
*Assistant Examiner*—Minhloan Tran
*Attorney, Agent, or Firm*—Nixon & Vanderhye

[57] ABSTRACT

In a photo-coupling device, a light emitting section, a light receiving section are housed in an opaque case so as to be opposed with respect to an object moving path intervening therebetween. The light emitting section and the light receiving section are provided with a light-projecting window and a light-receiving window on their opposite opaque case-wall-surfaces, respectively. A holder for holding the light emitting section or the light receiving section is arranged between the light emitting section and the light-projecting window and/or between the light receiving section and the light-gathering window. A light shading plate having a slit is attached to the holding means, and means for positioning the holder with the aid of the contact of the holding means with the case is attached to the case.

8 Claims, 22 Drawing Sheets

PHOTO-COUPLING DEVICE WITH IMPROVED LIGHT SHADING PLATE HOLDING MEANS

BACKGROUND OF THE INVENTION

1. Field of the Invention

The present invention relates to a photo-coupling device for detecting what is called a photo-interrupter, in a non-contact manner, the presence or absence of an object passing through an object moving path.

2. Description of the Related Art

An example of previously known photo-coupling devices is disclosed in Japanese Utility Model Application Serial No. 1990-105449 filed on Oct. 5, 1990 by the inventor of the present invention. The photo-coupling device disclosed in this application has such a structure as shown in FIGS. 1 and 2 described later. Specifically, a light emitting section 1 and a light receiving section 2 are arranged to be opposed with respect to an object moving path X intervening therebetween. The light emitting section 1 is a light emitting device (e.g., light emitting diode) molded with a light-permeating or transparent material whereas the light receiving section is a light receiving device (e.g., a photo-transistor) molded with the transparent material. These sections are housed in a case 3 made of an opaque material. A light-projecting window 4b and a light-gathering window 4a are provided at the opposite surfaces 3a and 3b of the light emitting section 1 and light receiving section 2, respectively. In order to increase light detection precision (resolution), a light shading plate 6 provided with a slit 5 is bonded to the surface 3b of the light gathering window 4b in the case 3 with a boding agent.

Generally, the slit 5 in the light shading plate 6 is bored by etching or stamping techniques.

In the photo-coupling device thus constructed, the light emitted from the light emitting section 1 toward the light receiving section 2 goes across the object moving path X via the light-projecting window 4a. Hence, the presence or absence of the light reaching the light receiving section 2 is determined by the presence or absence of the object Y passing through the object moving path X. As a result, the presence or absence of the object can be detected in accordance with the presence or absence of the light on the light receiving section 2.

The photo-coupling device having the above structure, however, provides the following defects.

(1) As described above, the light shading plate 6 provided with the slit 5 is attached to the case 3 in order to increase the accuracy of detecting the object. In this case, since the bonding agent 7 is used to attach the light shading plate 6 to the case 3, if any shock is added to the case 3, the light shading plate 6 will peel off the case 3.

(2) It is technically difficult to bond and process the light shading plate using the bonding agent. The bonding strength and the attaching state depend on the manner of dealing with the bonding agent. This gives rise to inconveniences such as a long working time and high production cost.

(3) Where the light emitting section and the light receiving section are provided with a light-projecting window 4a and a light-gathering window 4b at their opposed case-wall surfaces and the slit is provided on the window 4a or 4b, there is a relatively long distance between the light shading plate and the light emitting section or light receiving section. Thus, if the aperture width of the slit 5 is made narrow in order to increase detection accuracy of the light passing through the light diaphragm, the signal-to-noise ratio will decrease owing to interference among passing light beams in a light receiving system in which plural light diaphragm windows are arranged. This becomes also an obstacle in miniaturizing the photo-coupling device.

SUMMARY OF THE INVENTION

The present invention has been accomplished in order to solve the problems involved with the conventional photo-coupling device having the structure described above.

A first object of the present invention is to provide a photo-coupling device which houses, in its opaque case, a light emitting section and a light receiving section opposed with respect to an object moving path intervening therebetween, and can detect the presence or absence of an object-to-be-detected in a non-contact manner with high resolution.

A second object of the present invention is to provide a photo-coupling device which can attach a light shading plate provided with a light diaphragm window (i.e., a slit well known in the field of optics) to the opaque case with high workability and high holding force.

A third object of the present invention is to provide a photo-coupling device which has a light emitting section and a light receiving section housed in an opaque case and provided with a light-projecting window and a light-gathering window on their opposite opaque case-wall-surfaces, respectively, and can reduce the distance the opposite case-wall-surfaces and a light shading plate provided with a slit thereby to lessen the light interference due to diffraction of the light passing through the slit and to the signal-to-noise ratio in the light receiving section.

The above objects can be achieved by an photo-coupling device comprising a light emitting section, a light receiving section, an opaque case for housing the light emitting section and the light receiving section opposed with respect to an object moving path intervening therebetween, said light emitting section and said light receiving section being provided with a light-projecting window and a light-receiving window on their opposite opaque case-wall-surfaces, respectively, wherein a means for holding the light emitting section or the light receiving section is arranged between the light emitting section and the light-projecting window and/or between the light receiving section and the light-gathering window, the light shading plate having a slit is attached to the holding means, and a means for positioning the holding means with the aid of the contact of the holding means with the case is attached to the opaque case.

Since the means for holding the slit provided with the light diaphragm window is arranged between the light emitting section and the light-projecting window and/or between the light receiving section and the light-gathering window, unlike the conventional photo-coupling device, there is no need of bonding the light shading plate using a bonding agent. Thus, the time required to attach the light shading plate can be shortened remarkably. The light shading plate, after being attached, can also maintain its stabilized attached state.

In accordance with one aspect of the present invention, there is provided a photo-coupling device comprising a light emitting section provided with a light emitting device, a light receiving section provided with a light receiving device, a light shading or opaque case made of metal for housing the light emitting section and the light receiving section opposed with respect to an object moving path intervening therebetween, said light emitting section and said light receiving section being provided with a light-projecting window and a light-gathering window on their opposite opaque case-wall-surfaces, respectively, and a light shading plate having a slit provided on one of opposite surfaces of the light-projecting window and the light-gathering window, wherein means for holding the light emitting section or the light receiving section is arranged between the light emitting section and the light-projecting window and/or between the light receiving section and the light-gathering window, the light shading plate is fixed to the holding means, and means attached to the case for positioning the holding means with the aid of the contact of the holding means with the case.

The above holding means may have different color tones according to different types of apparatus in which the photo-coupling device is used.

The above light shading plate provided with the slit may have one end fixed to the holding means and the other end placed in a free state by insert molding or thermocompression bonding molding.

Means for preventing the holding means from coming off from the case may be attached to the holding means so as to be engaged with the case.

A concave portion for preventing the light emitting section or light receiving section coming off from the holding means may be provided so as to fit in the light emitting section o light receiving section on the surface where the holding means is kept in contact with the light emitting section or the light receiving section.

In accordance with another aspect of the present invention, there is provided a photo-coupling device comprising a light emitting section provided with a light emitting device, a light receiving section provided with a light receiving device for receiving the light projected from the light emitting device, an opaque case for housing the light emitting section and the light receiving section opposed with respect to an object moving path intervening therebetween, said light emitting section and said light receiving section being provided with a light-projecting window and a light-gathering window on their opposite opaque case-wall-surfaces, respectively, a light shading plate having a slit provided on the surface of the light-gathering window, means for holding the light emitting section or the light receiving section arranged between the light emitting section and the light-projecting window and/or between the light receiving section and the light-gathering window, the light shading plate being fixed to the holding means, and means for positioning the holding means with the aid of the contact of the holding means with the case, wherein the holding means holds the light emitting section, the light receiving section and the light shading plate by integral molding.

In accordance with still another aspect of the present invention, there is provided a photo-coupling device comprising a light emitting section provided with a light emitting device, a light receiving section provided with a light receiving device for receiving the light projected from the light emitting device, an opaque case for housing the light emitting section and the light receiving section opposed with respect to an object moving path intervening therebetween, said light emitting section and said light receiving section being provided with a light-projecting window and a light-gathering window on their opposite opaque case-wall-surfaces, respectively, a light shading plate having a slit provided on the surface of the light-gathering window, means for holding the light emitting section or the light receiving section arranged between the light emitting section and the light-projecting window and/or between the light receiving section and the light-gathering window, the light shading plate being fixed to the holding means, and means for positioning the holding means with the aid of the contact of the holding means with the case, the holding means holding the light emitting section, the light receiving section and the slit by integral molding, wherein the light shading plate provided with the slit has one end fixed to the holding means and the other end placed in a free state by insert molding or thermocompression bonding molding.

In accordance with a further aspect of the present invention, there is provided a photo-coupling device comprising a light emitting section provided with a light emitting device, a light receiving section provided with a light receiving device for receiving the light projected from the light emitting device, an opaque case for housing the light emitting section and the light receiving section opposed with respect to an object moving path intervening therebetween, said light emitting section and said light receiving section being provided with a light-projecting window and a light-gathering window on their opposite opaque case-wall-surfaces, respectively, a light shading plate having a slit provided on the surface of the light-gathering window, means for holding the light emitting section or the light receiving section arranged between the light emitting section an the light-projecting window and/or between the light receiving section and the light-gathering window, the light shading plate being fixed to the holding means, and means for positioning the holding means with the aid of the contact of the holding means with the case, the holding means holding the light emitting section, the light receiving section and the slit by integral molding, wherein the holding means has different color tones according to different types of apparatus in which the photo-coupling device is used.

In accordance with a still further aspect of the present invention, there is provided a photo-coupling device comprising a light emitting section provided with a light emitting device, a light receiving section provided with a light receiving device for receiving the light projected from the light emitting device, an opaque case for housing the light emitting section and the light receiving section opposed with respect to an object moving path intervening therebetween, said light emitting section and said light receiving section being provided with a light-projecting window and a light-gathering window on their opposite opaque case-wall-surfaces, respectively, a light shading plate having a slit provided on the surface of the light-gathering window, means for holding the light emitting section or the light receiving section arranged between the light emitting section and the light-projecting window and/or between the light receiving section and the light-gathering window, said light shading plate being fixed to the holding means, and means for positioning the holding means with the aid of the contact of the holding means with the case, the holding means holding the light emitting section, the light receiving section and the slit by integral molding, wherein means for preventing the holding means from coming off from the case so as to be engaged with the case is attached to the holding means, and a concave portion for preventing the light emitting section or light receiving section coming off from the holding means is provided so as to fit in the light emitting section or light receiving section on the surface where the holding means is kept in contact with the light emitting section or the light receiving section.

The above and other objects and features of the present invention will be more apparent from the following description of embodiments taken in conjunction with the accompanying drawings.

DESCRIPTION OF THE PREFERRED EMBODIMENTS

Figure 1:
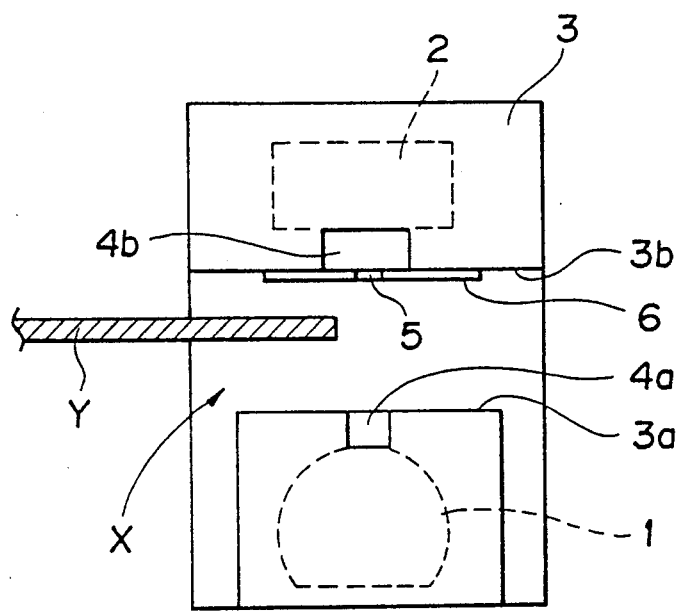
FIG. 1 is a plan view showing the schematic structure of art photo-coupling device.
Figure 2:
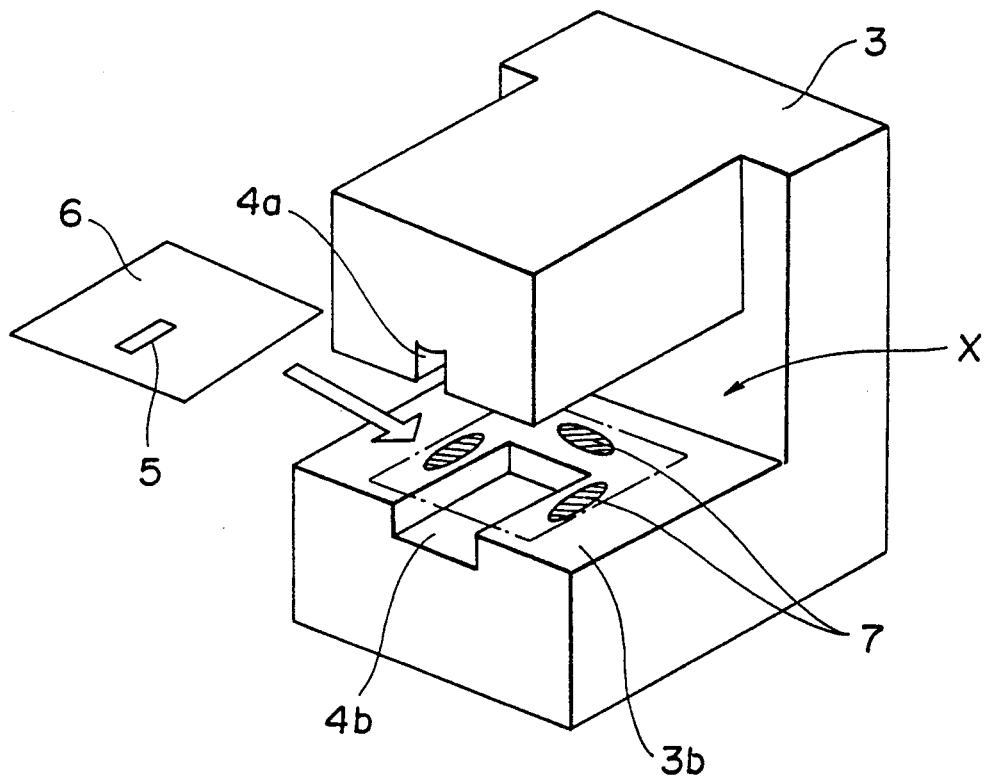
FIG. 2 is an exploded perspective view of the photo-coupling device shown FIG. 1.

Now referring to the drawings, an explanation will be given of several preferred embodiments of the present invention. It should be noted that like elements are denoted with like reference numerals in the prior art photo-coupling device as shown in FIGS. 1 and 2.

EMBODIMENT 1

FIGS. 3 to 18 show the structure of the photo-coupling device according to the first embodiment of the present invention. As seen from these figures, the photo-coupling device according to this embodiment serves to detect the presence or absence of an object-to-be-detected passing through an object moving path X, and comprises a light emitting section 1 provided with a light emitting device, a light receiving section 2 provided with a light receiving device and a case 3 made of light shading material for housing the light emitting section 1 and the light receiving section 2 opposed with respect to the object moving path X intervening therebetween. The light emitting section 1 and said light receiving section 2 are provided with a light-projecting window 4a and a light-gathering window 4b on their opposite case-wall-surfaces.

A holder 10 for holding the light receiving section 2 is arranged between the light receiving section 2 and the light gathering window 4b. A metallic light-shading plate 6 provided with a slit 5 is attached to the holder 10. The case 3 is provided with means 20 for positioning the holder 10 with the aid of the contact of the holder with the case 3.

The light emitting section 1 and the light receiving section 2 include a light emitting device and a light receiving device, respectively. Theses devices are mounted on individual lead frames 31 and 32 and molded with transparent resin 7.

Figure 6:
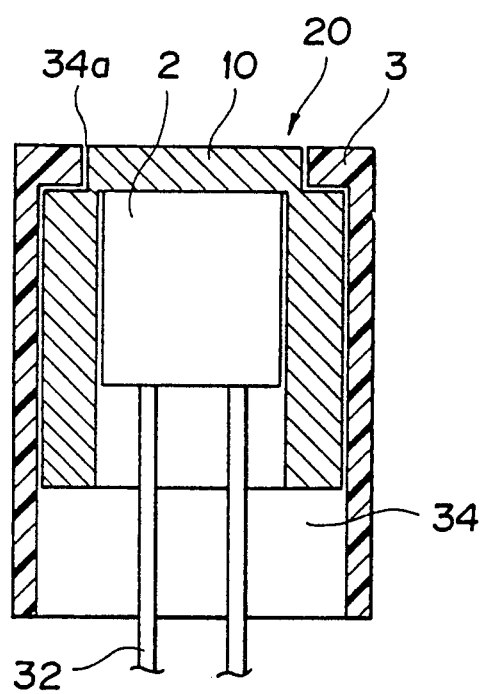
FIG. 6 is a sectional view taken on line B—B in FIG. 3.
Figure 7:
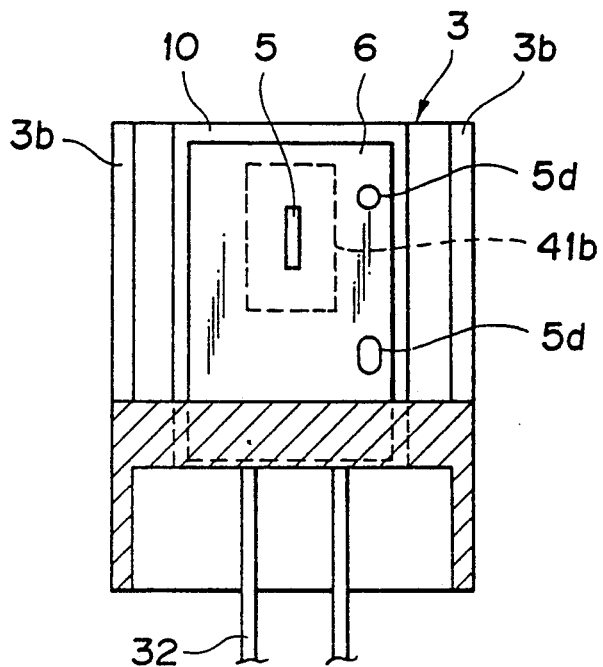
FIG. 7 is a sectional view taken on line C—C in FIG. 3.
Figure 8:
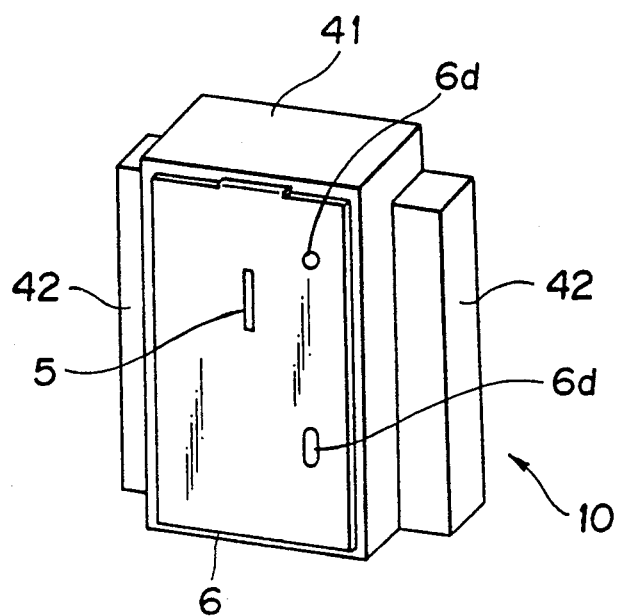
FIG. 8 is a perspective view of a holder which is means for holding the light emitting section or the light receiving section of the photo-coupling device shown in FIG. 3.
Figure 9:
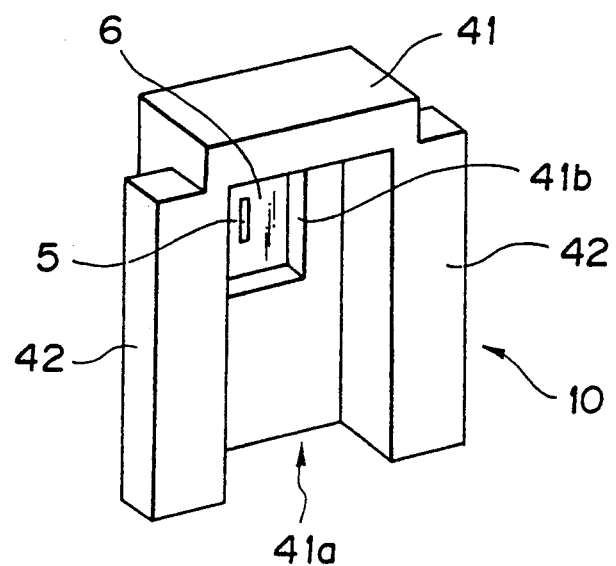
FIG. 9 is a perspective view of the holder shown in FIG. 8 when viewed from its rear.
Figure 10:
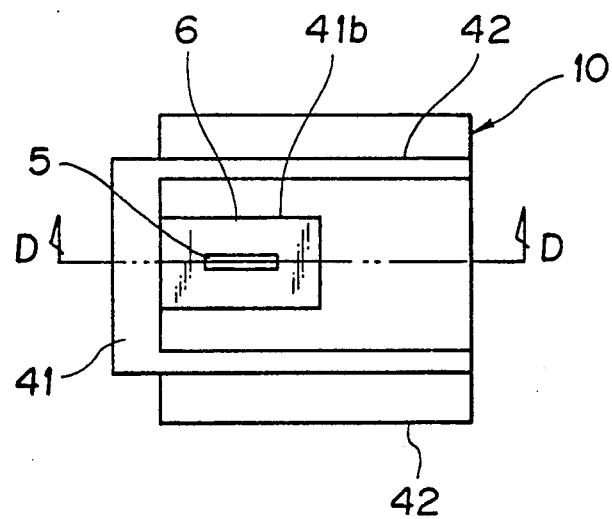
FIG. 10 is a rear elevation of the holder shown in FIG. 9.
Figure 11:
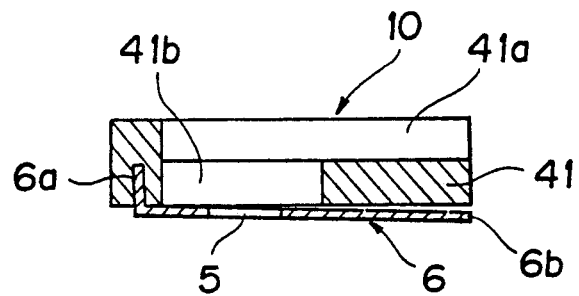
FIG. 11 is a view taken on line D—D in FIG. 10.
Figure 12:
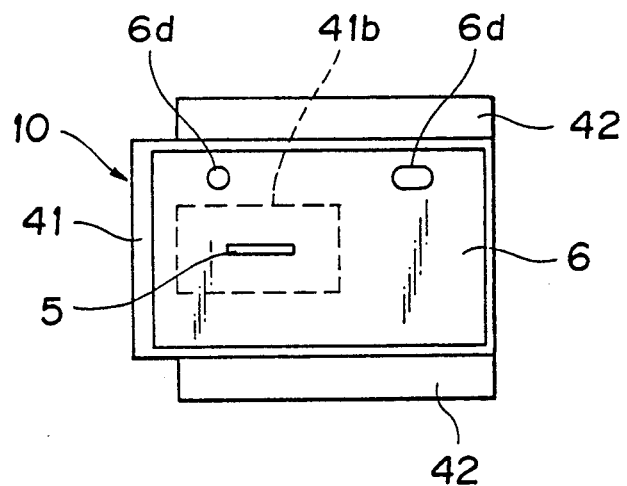
FIG. 12 is a front view of FIG. 10.
Figure 13:
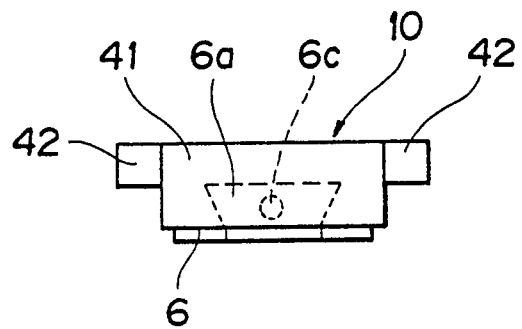
FIG. 13 is plan view of the holder shown in FIG. 12.
Figure 14:
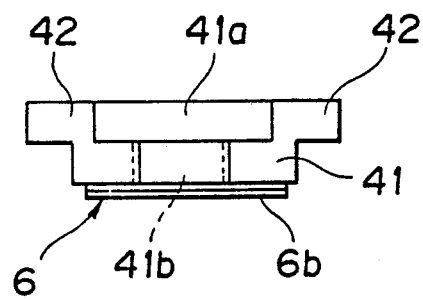
FIG. 14 is a bottom view of the holder shown in FIG. 12.
Figure 15:
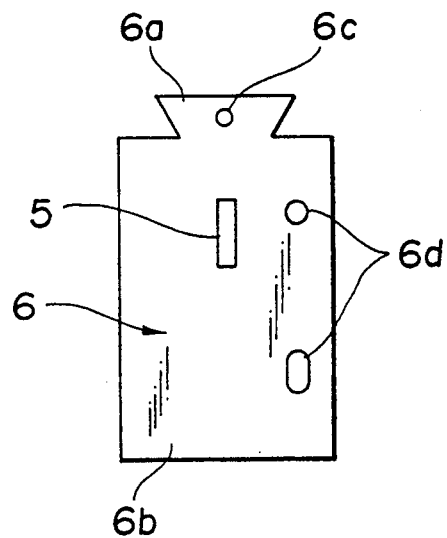
FIG. 15 is a view of the light shading plate provided with a the photo-coupling device shown in FIG. 3.
Figure 16:
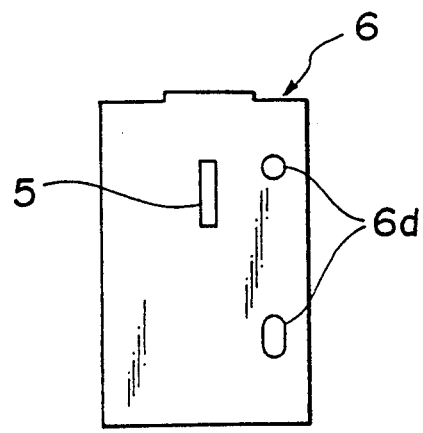
FIG. 16 is a front view of the light shading plate subjected to bending process of the photo-coupling device shown in FIG. 3.
Figure 17:
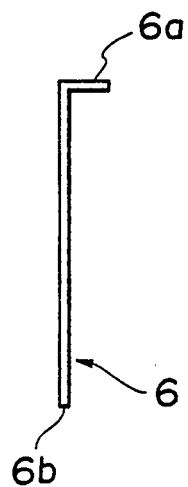
FIG. 17 is a side view of the light shading plate shown in FIG. 16.
Figure 18:
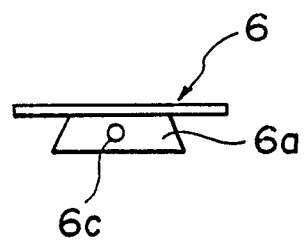
FIG. 18 is a bottom view of the light shading plate shown in FIG. 16.

The case 3 is made of light shading material and formed in a "J" character structure with its lower surface opened. This structure comprises a chamber 33 for housing the light emitting section 1, a chamber 34 for housing the light receiving section 2 and a coupling part 35 arranged between these chambers and constituting the object moving path together with them. As shown in FIG. 6, the chamber 34 is provided, on its upper surface, with an opening 34a leading to the light-gathering window 4a.

Figure 3:
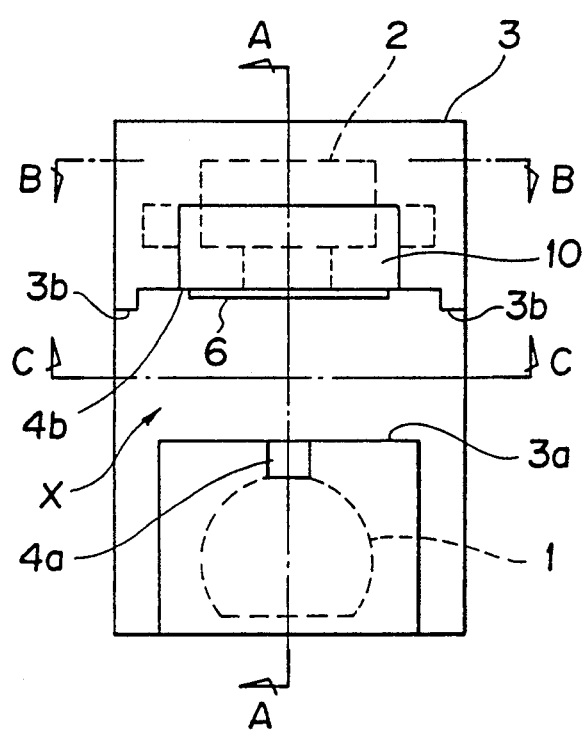
FIG. 3 is a plan view of the photo-coupling device according to a embodiment of the present invention.
Figure 4:
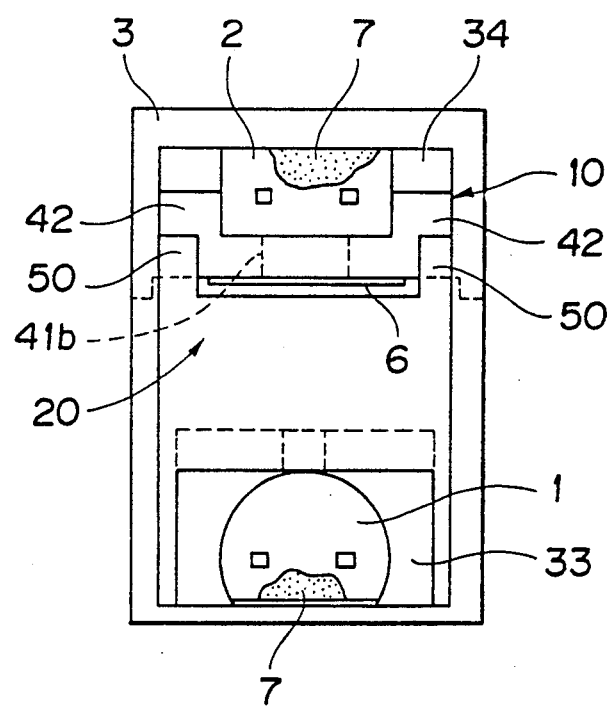
FIG. 4 view of the photo-coupling device shown in FIG. 3.

As seen from FIGS. 3 and 4, the light-projecting window 4a and the light-gathering window 4b are formed longitudinally from the opposite wall surfaces of the case 3. In this case, the width of the light-gathering window 4b is larger than that of the light-projecting window 4a. The wall 50 of the light-gathering window 4b is formed to protrude inwardly.

The holder 10 has the shape as shown in FIGS. 8 to 14. Specifically, the holder 10 comprises a holder body 41 which supports the light shading plate 6 and fits in the light-gathering window 4b and the opening 34a of the chamber 34, and a projecting guide 42 integrally attached on both sides of the holder body 41. The holder 10 has a longitudinal sectional "L" character shape. The holder body 41 is provided with a light guide opening 41b penetrating through the body 41 from its front surface and a concave portion 41a on its rear surface. The light guide opening 41b serves to guide the light emitted from the light emitting section and converged by the slit 5 to the light receiving section 2. The concave portion 41a serves to receive the light receiving section 2.

As seen from FIGS. 15 to 18, the light shading plate 6 is provided with a slit 5 formed by etching or press processing at its predetermined position and having a minute width. The light shading plate 6 is also provided with a wedge-shaped bending slice 6a integrally formed in its upper end. Further, as seen from FIG. 16, the bending slice 6a is bent by press processing to form the light shading plate 6 in a "L" character shape. Thereafter, insert molding is executed so that as seen from FIG. 11, the one end (bending slice) of the light shading plate 6 is embedded in the holder 10 to be fixed there and the other end thereof is made free. Incidentally, in FIGS. 12, 13 and 15, 6c denotes a hole for preventing the light shading plate 6 from coming off from the holder 10 owing to spreading of the resin for shaping the holder and 6d denotes a pin hole into which a positioning pin is inserted when the light shading plate 6 is set in a holder shaping mold.

As seen from FIGS. 4 and 6, the positioning means 20 is composed of an opening 34a of the chamber 34 for holding the upper part of the holder body 41 in a fit manner and a wall surface 50 of the light-gathering window 4b which protrudes to a position contacting a guide 42 of the holder 10 to supporting the guide 42.

The photo-coupling device according to this embodiment will be fabricated as follows.

Figure 5:
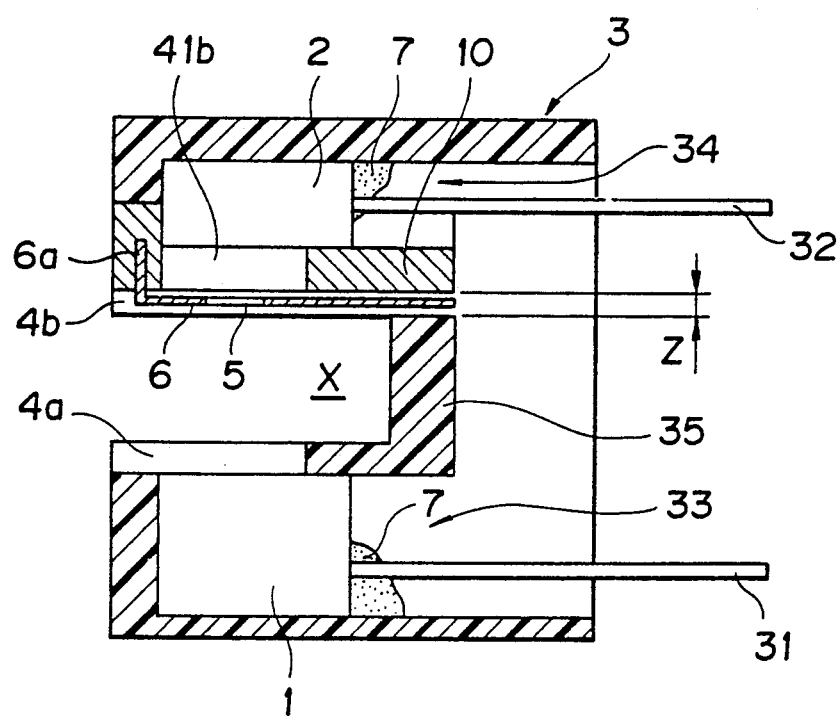
FIG. 5 is a sectional view taken on line A—A in FIG. 3.

As shown in FIG. 5, the light emitting section 1 is inserted into the chamber 33 of the case and fixed there using the bonding agent 7. On the other hand, the holder 10 is inserted into the chamber 34 from below so that the guide 42 of the holder 10 provided with the light shading plate 6 having the slit 5 moves along the wall surface 50 of the chamber 33.

Then, the positioning means 20 which supports the upper part of the holder body 41 and the guide 42 of the holder 10 is arranged as shown in FIGS. 4 and 6. The positioning means 20 positions the holder 10 with the aid of contact of the holder 10 with the case 3.

Specifically, the position of the holder 10 in its front-rear and vertical directions is determined when the upper part of the holder body 41 is held by the opening 34a in a fit manner, and that in the left-right direction is determined when the guide 42 of the holder 10 is brought into contact with the wall surface of the case 3.

Thereafter, the light receiving section 2 is inserted in the concave portion 41a of the holder 10 and fixed there using the bonding agent. Thus, the light receiving section 2 is bonded to the case 3 in such a way that it is kept in contact with the holder 10 so that the holder 10 will be also fixed to the case 3 through the case 3.

In this way, the holder 10 provided with the light shading plate 6 having the slit 5 is arranged between the light receiving section 2 and the light-gathering window 4b, and the positioning means for positioning the holder 10 with the aid of the contact of the holder with the case 3 is attached to the case 3. Thus, unlike the prior art, there is no need of bonding the slit with high resolution and high positioning accuracy to the case using the bonding agent. As a result, the working time can be shortened and the attaching state of the light shading plate for each product can be made uniform.

With respect to the light shading plate 6 having the slit 5, by the insert molding, its one end 6a is fixed to the holder 10 by being embedded therein whereas the other end 6b will be automatically supported in the gap Z formed when holder 10 is fit in the case 3. Thus, application of external force such as shock will not cause the light shading plate 6 to come off. The other end 6b of the light shading plate 6 supported in the gap Z (see FIG. 5) is placed in a free state where it is not bonded nor force-fit. Hence, when an environmental temperature changes, stress which is generated owing to difference in the thermal change such as expansion and contraction between resin and metal will not be applied to the end 6b. As a result, the light shading plate is difficult to warp.

Further, the light shading plate 6 is set in a holder shaping mold and subjected to insert molding to complete the holder 10. Then, a pin(s) corresponding to the positioning pin hole(s) 6d in the light shading plate 6 may be provided in the mold to improve the uniform attaching accuracy of the holder 10 and the slit 5 in the light shading plate.

As a result, there can be provided a photo-coupling device which permits the light diaphragm window to be incorporated with high resolution with high accuracy and at low cost and permits the light shading plate to be attached with high strength.

EMBODIMENT 2

In the photo-coupling device according to Embodiment 1, in order to change the resolution, the width of the slit 5 of the light shading plate 6 has only to be changed, and so the shapes of complete products remain substantially unchanged with different resolutions. Hence, if products of the photo-coupling device with slightly different widths (i.e, resolutions) of the slit are fabricated, it is difficult to distinguish one from the other products since the shapes of the complete products and the corresponding holders are very similar. This may give rise to the problem of mixing of components of a different type of device in the process of fabricating a certain photo-coupling device.

This embodiment intends to provide a photo-coupling device which has the feature of the photo-coupling device according to Embodiment 1 and can be easily distinguished from others, and its components. To this end, the material for shaping the holder 10 provided with the light shading plate 6 having the slit 5 is caused to have different color tones of black and others (red, blue, etc.) according to different types of devices. The remaining structure of the photo-coupling device according to this embodiment is the same as that according to Embodiment 1. Different color tones of the material of the holder 10 can be easily recognized because the tip of the holder 10 appears at the front of the photo-coupling device when the photo-coupling device is assembled. Hence, different complete photo-coupling device and the corresponding holders can be easily distinguished. If the color tone of the holder 10 is changed according to different types of devices, printing the type name of a complete product can be omitted.

Additionally, although changing the color tone does not permit a light shading material to be used as the material for the holder 10, this also gives an advantage in design that various color tones can be used because the light shading plate 6 can manage the light shading function for the light emitting device and the light receiving device.

EMBODIMENT 3

Figure 19:
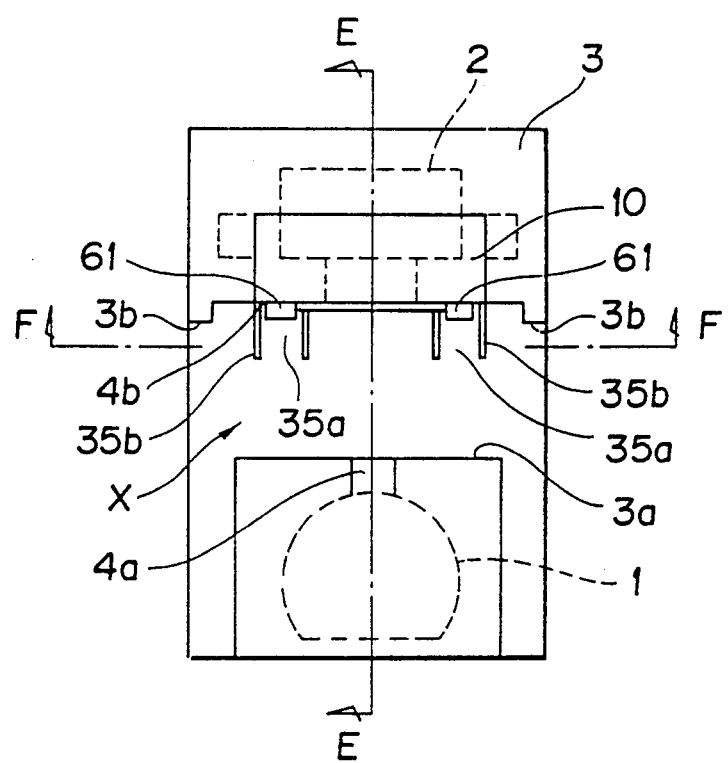
FIG. 19 is a plan view of the photo-coupling device according to a third embodiment of the present invention.
Figure 20:
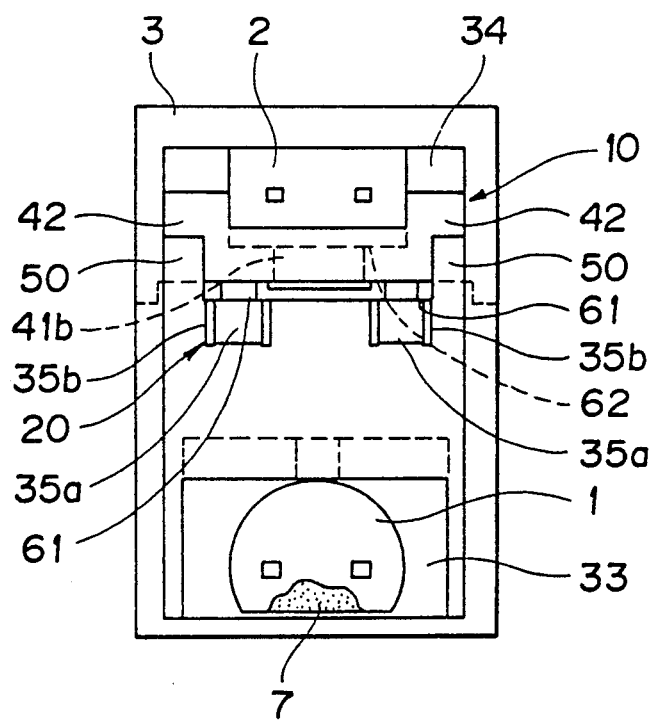
FIG. 20 is a bottom view of the photo-coupling device shown in FIG. 19.
Figure 21:
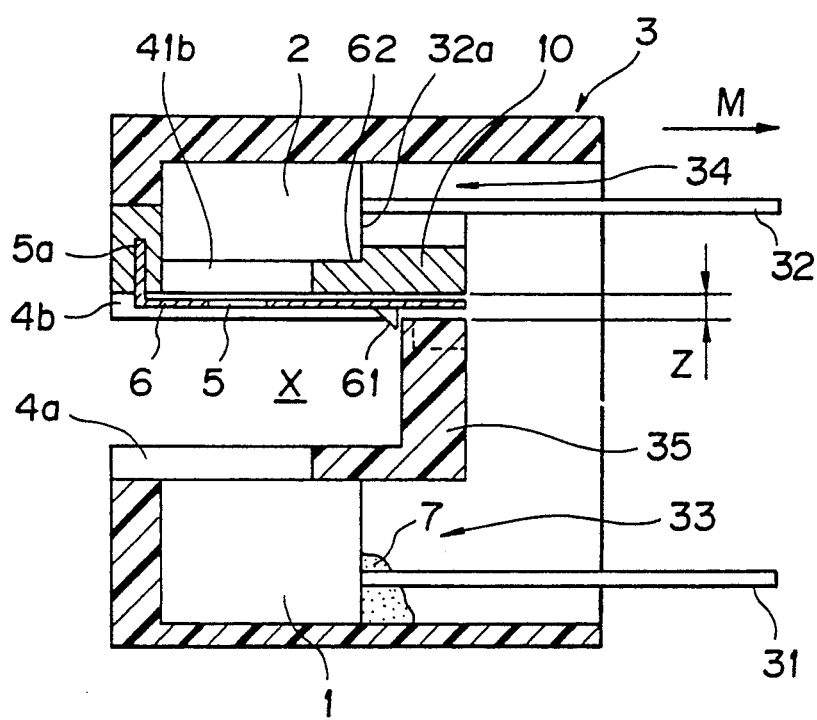
FIG. 21 is a sectional view taken on line E—E in FIG. 19.
Figure 22:
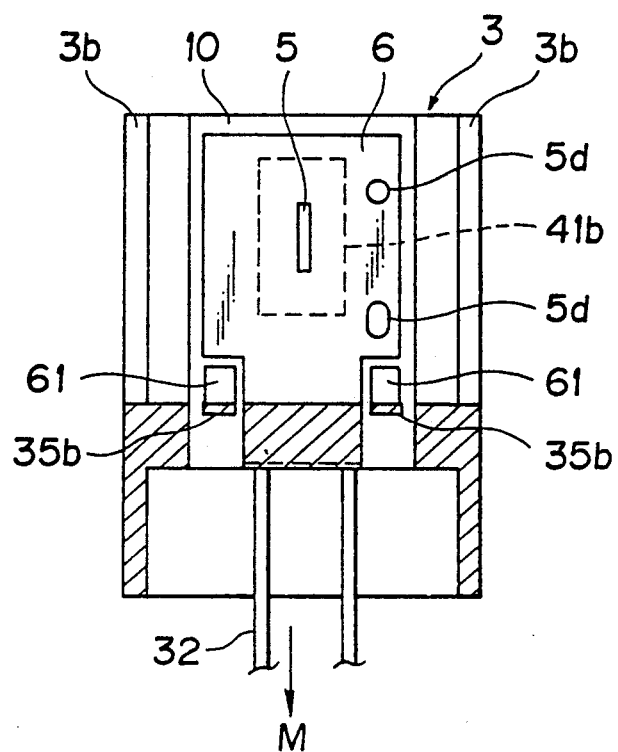
FIG. 22 is a sectional view taken on line F—F in FIG. 19.
Figure 23:
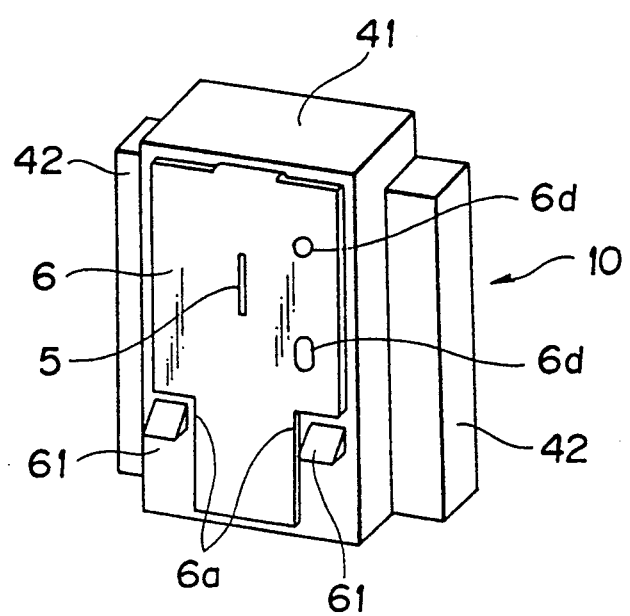
FIG. 23 is a perspective view of the holder of the photo-coupling device shown in FIG. 19.
Figure 24:
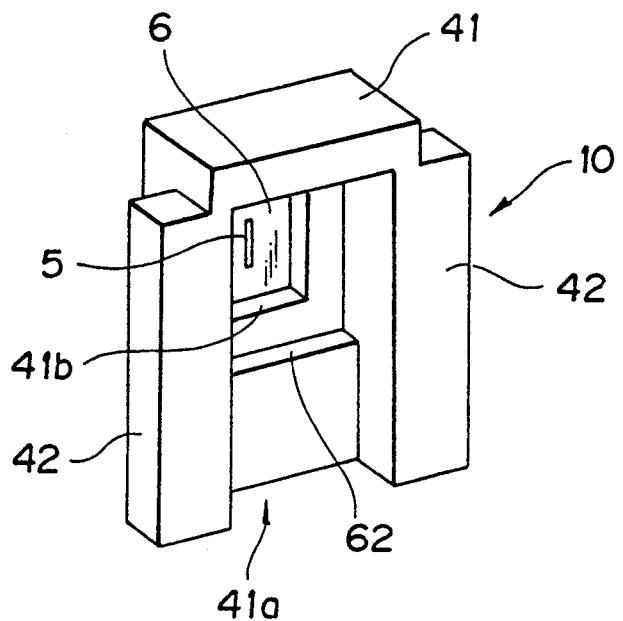
FIG. 24 is a perspective view of the holder shown in FIG. 23 when viewed from its rear.
Figure 25:
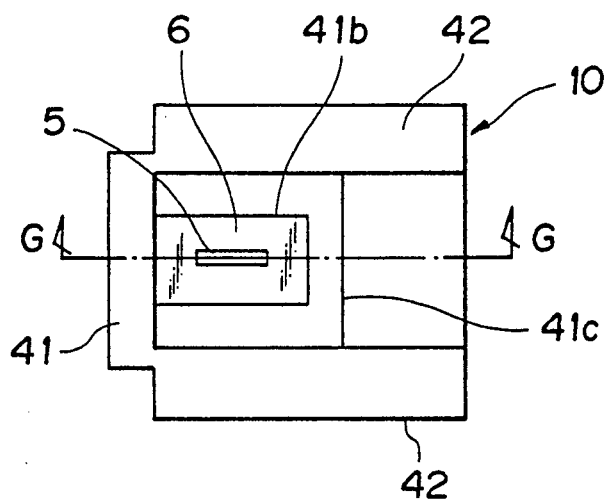
FIG. 25 rear elevation of the holder shown in FIG. 19.
Figure 26:
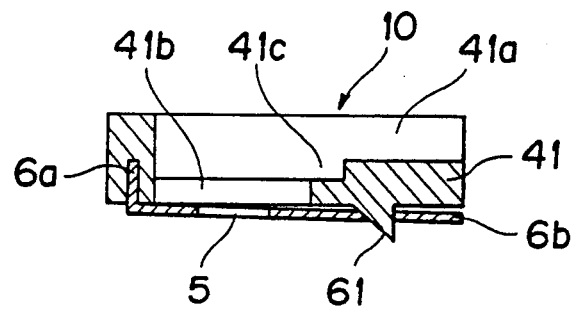
FIG. 26 is a sectional view taken on line G—G in FIG. 25.
Figure 27:
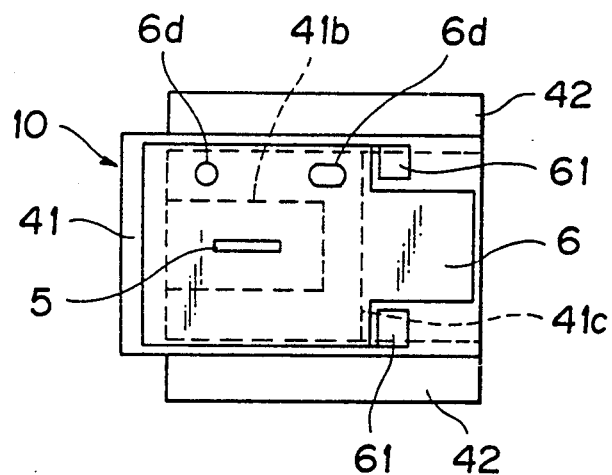
FIG. 27 is a front view of the holder shown in FIG. 24.
Figure 28:
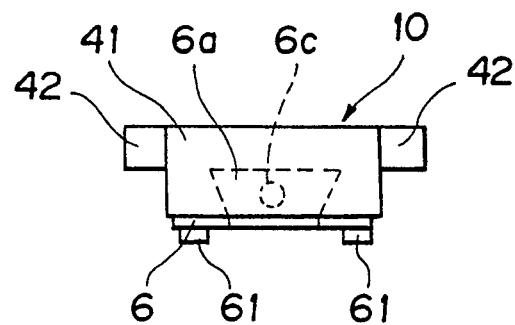
FIG. 28 is a of the holder shown in FIG. 24.
Figure 29:
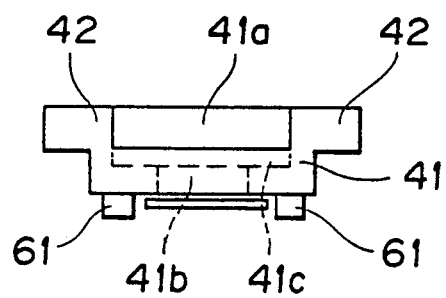
FIG. 29 is a bottom view of the holder shown in FIG. 24.

Now referring to FIGS. 19 to 29, an explanation will be given of the third embodiment of the present invention. FIG. 19 is a plan view of the photo-coupling device according to a third embodiment of the present invention; FIG. 20 is a bottom view of the photo-coupling device shown in FIG. 19; FIG. 21 is a sectional view taken on line E—E in FIG. 19; FIG. 22 is a sectional view taken on line F—F in FIG. 19; FIG. 23 is a perspective view of the holder of the photo-coupling device shown in FIG. 19; FIG. 24 is a perspective view of the holder shown in FIG. 23 when viewed from its rear; FIG. 25 is a rear elevation of the holder shown in FIG. 19; FIG. 26 is a sectional view taken on line G—G in FIG. 25; FIG. 27 is a front view of the holder shown in FIG. 24; FIG. 28 is a plan view of the holder shown in FIG. 24; and FIG. 29 is a bottom view of the holder shown in FIG. 24;

The photo-coupling devices according to Embodiments 1 and 2 require bonding agent to finally fix their components. This requires work of managing the amount of the bonding agent to be applied and injecting it. This embodiment intends to omit this work. As shown in the above figures, engagement means 61 for preventing the holder 10 from coming off, in the direction M of the rear of the case 3, from the case 3 is attached to the holder 10 so as to be engaged with the case 3. A concave portion 62 (FIGS. 21, 24) for preventing the light emitting section 1 or light receiving section 2 coming off, in the direction M of extracting the lead frame 32 from the holder 10 is provided so as to fit in the light emitting section 1 or light receiving section 2 on the surface where the holder 10 is kept in contact with the light emitting section 1 or the light receiving section 2.

As shown in FIGS. 19 to 23, the engagement means 61 comprises hooks protruded on the side of the light exposure surface (bottom surface) of the holder 10 and a flexible contact portion 35a formed on the side of the path of a coupling portion of the case 3. Each of the hooks has a triangle shape with the face inclined only in an insertion direction in view of easiness of inserting the holder 10 from the rear of the case 3. In order that movement of the hook 61 is not hindered when the holder 10 is inserted, the contact portion 35a of the coupling portion 35 in contact with the hook 61 is made thinner than the periphery of the coupling portion 35, and a slit 35b is also cut out. Thus, the contact portion 35a is made flexible in the moving direction of the hook. The light shading plate 6 has cutout portions 6a at the positions corresponding to the hooks 61.

The concave portion 62 has the same shape as the light receiving surface of the light receiving section 2 so that the light receiving surface is embedded in the concave portion 62.

In the above arrangement, first, the light receiving section 2 is fit in the concave portion of the holder 10. Thus, the position relationship between the light receiving section 2 and the light shading plate 6. Next, the holder 10 fit in the light receiving section 2 is inserted into the chamber 34 from the rear of the case 3. The inclined face of the hook 61 of the holder 10 comes into contact with the contact portion 35a of the coupling portion 35 so that it forcibly pushes down the contact portion 35a in the movement direction of the hook 61 by pressing force. The contact portion 35a pushed down, after the hook 61 passes, is resiliently restored to its original state. As a result, this contact portion 35a can prevent the hook 61 from coming off from the case 3 toward the rear of the case 3.

As described above, since the photo-coupling device according to this embodiment comprises the engagement means (or hook 61) for engaging the holder 10 with the case 3 and the concave portion 62 for fitting the light receiving section 2 in the holder 10, the case 3, the holder 10 and the light receiving section 2 can be fixed to one another without the bonding agent for fixing the light receiving section. Thus, canceling the bonding agent and simplifying the bonding work permits the photo-coupling device to be fabricated at low cost.

Figure 30:
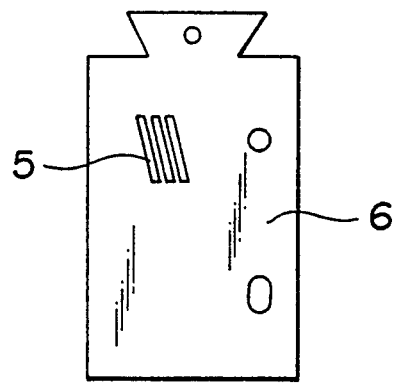
FIG. 30 is a front view of the light shading plate provided with a plurality of slit of the photo-coupling device according to a modification of the third embodiment of the present invention.
Figure 31:
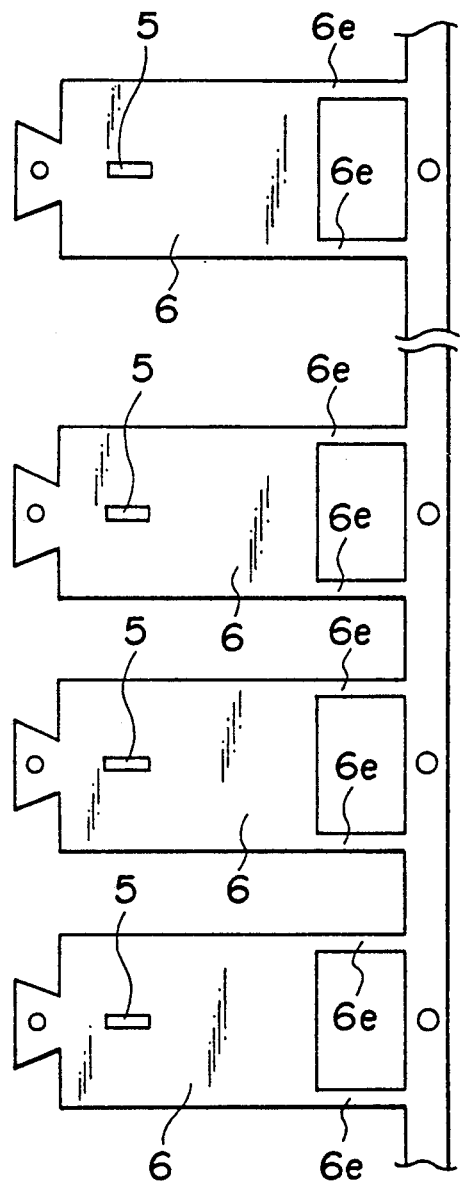
FIG. 31 is a front view of the light shading plate provided with a slit according to another modification of the third embodiment of the present invention.

Additionally, the present invention should be not limited to the embodiments described above, but can be changed or modified in various manners within the scope of the present invention. For example, the holder may be located on the side of the light emitting section. Further, in the above embodiments, although the basis photo-coupling device having a single slit 5 have been described, as shown in FIG. 30, the light shading plate 6 may be provided with a plurality of light windows. As shown in FIG. 31, if the light shading plate, after being formed in a frame shape and bent, is fixed to the holder by insert molding to cut a joint 6e, the workability can be further improved. Incidentally, the light shading plate may be fixed to the holder by thermocompression to provide the same meritorious effect.

Further, in Embodiment 3, although the engagement means (hook 61) is formed to protrude on the light exposure side of the holder 10, it may be formed on the side of the holder 10. The shape of the hook 61 may be arcing or concave in its section.

EMBODIMENT 4

FIGS. 32A to 32E and FIGS. 33A to 33E show the schematic arrangements of the photo-coupling device according to this embodiment and the holder used in the photo-coupling device, respectively.

Figure 32A:
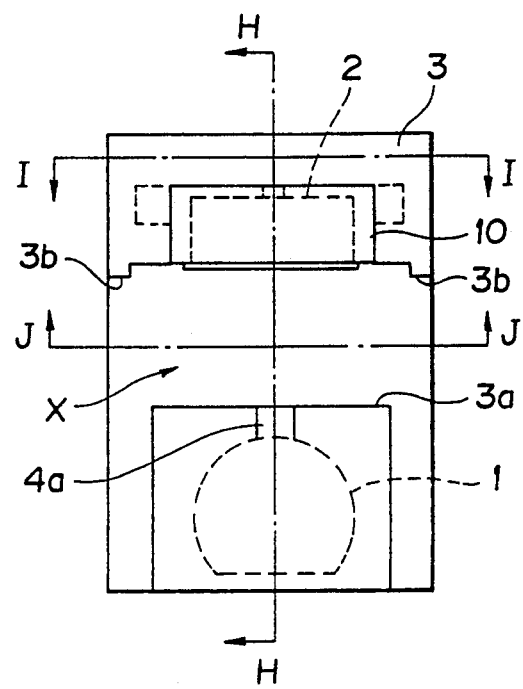
FIG. 32A is a front view of the photo-coupling device according to a fourth embodiment of the present invention.
Figure 32B:
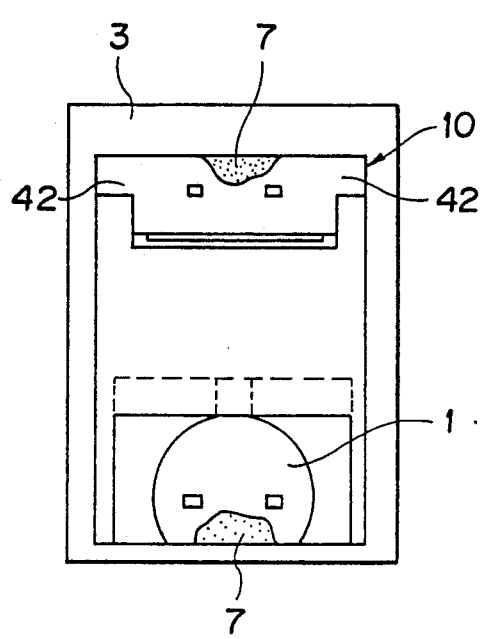
FIG. 32B is a rear elevation of the photo-coupling device shown in FIG. 32A.
Figure 32C:
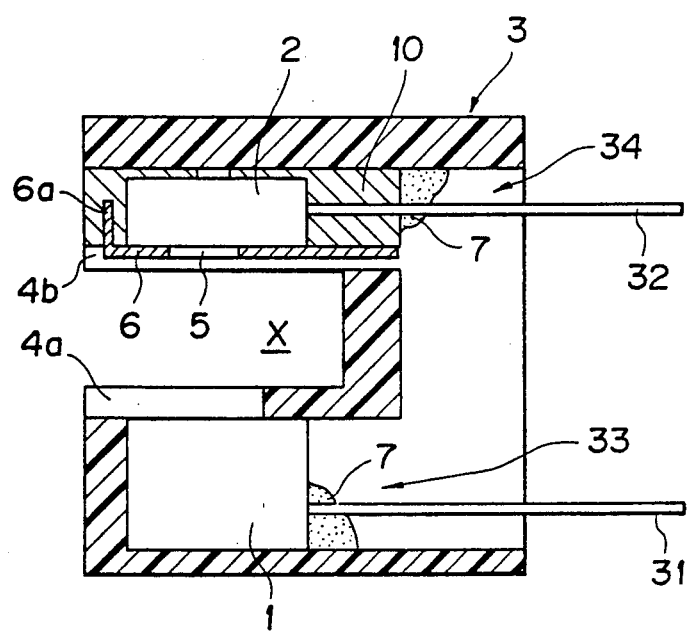
FIG. 32C is a sectional view taken on line H—H in FIG. 32A.
Figure 32D:
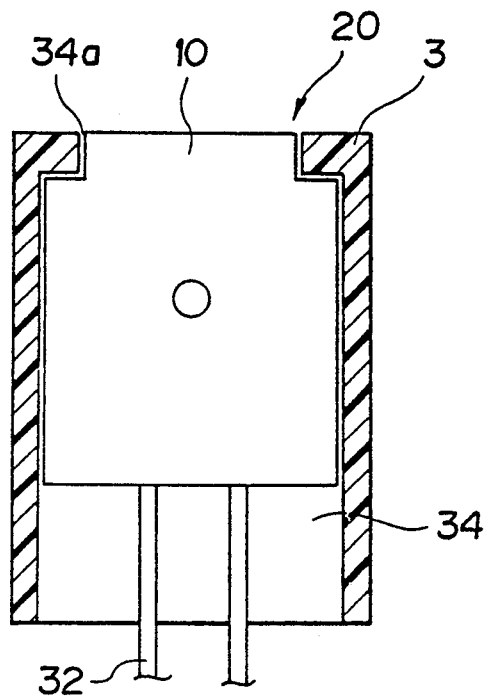
FIG. 32D is a sectional view taken on line I—I in FIG. 32A.
Figure 32E:
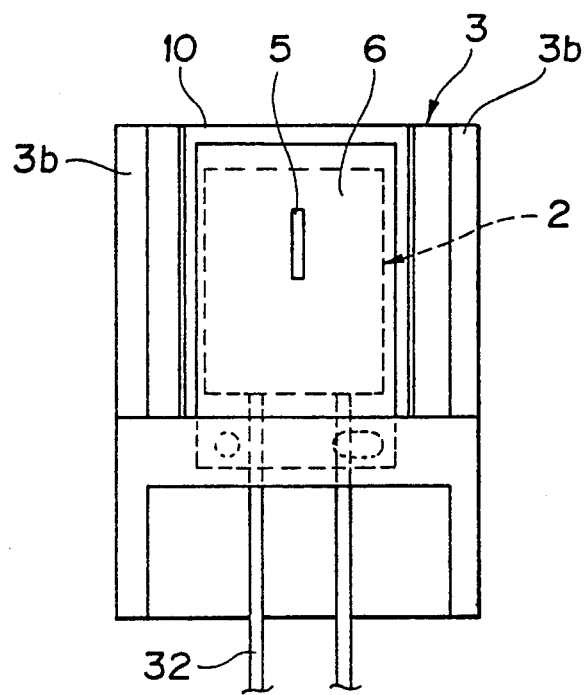
FIG. 32E is a sectional view taken on line J—J in FIG. 32A.
Figure 33E:
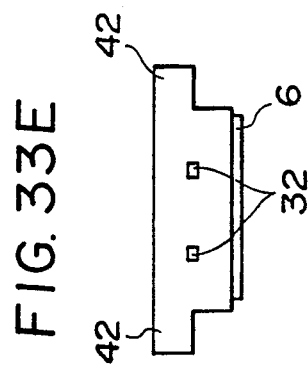
FIG. 33E side view of FIG. 33A.
Figure 33A:
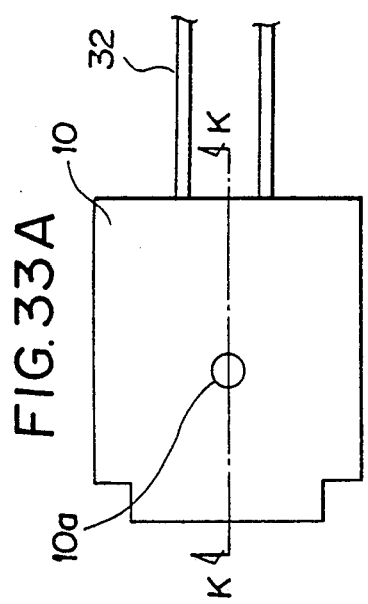
FIG. 33A is view of the holder of the photo-coupling device FIG. 32A.
Figure 33B:
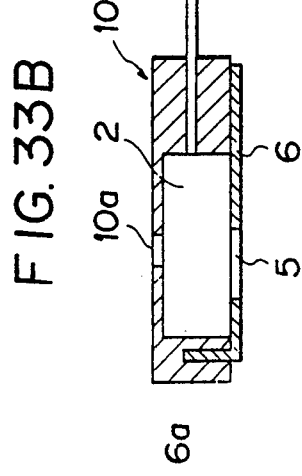
FIG. 33B is view taken on line K—K in FIG. 33A.
Figure 33C:
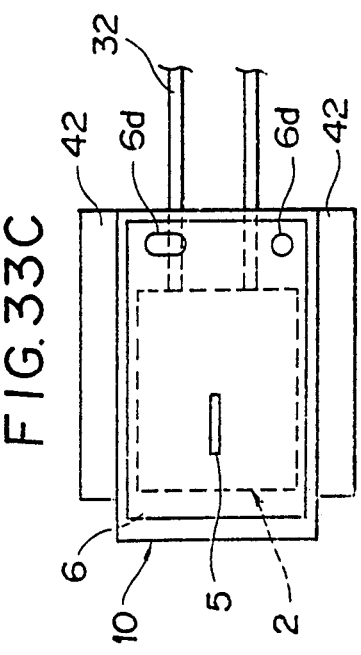
FIG. 33C is of FIG. 33A.
Figure 33D:
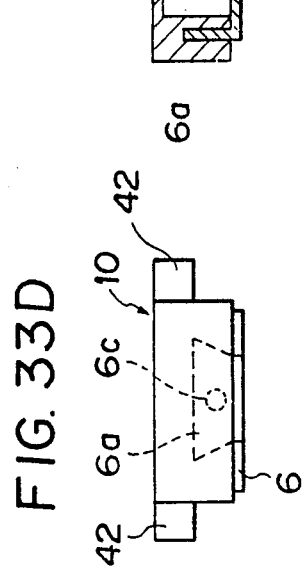
FIG. 33D side view of FIG. 33A.

In the photo-coupling device according to this embodiment, as seen from FIG. 32C (also FIGS. 32E, 33B and 33C), a light receiving section (Specifically a light receiving device) 2 and a light shading plate 6 (Specifically a metal plate) provided with a slit 5 are integrally held by a holder 10 by integral molding.

The metal plate 6 is arranged within a mold for the holder 10 through positioning holes 6d, and the light receiving device is arranged on the metal plate 6. The light receiving device is positioned relatively with the holder mold with the aid of the positioning holes which are used in molding the device or cutting a tie-bar (It should be noted that generally, devices are connected in series by joints until they are divided into individual device units and the positioning holes are arranged on the joints). In molding, in order to prevent resin from spreading, with the light receiving face of the light receiving device 2 and the metal plate 6 is kept in intimate contact, the receiving device 2 is fixed in such a manner that a pressing pin is pressed onto its rear. Since the resin does not spread to the pressing pin, a hole 10a is formed in the holder 10 after it has been molded.

The holder 10 and the light receiving device 2 thus constructed are housed in a case 3 and fixed there by bonding agent 7 so that the photo-coupling device as shown in FIGS. 32A to 32E is completed. It should be noted that the holder 10 is positioned relatively with the case 3 in the same manner as described with reference to FIGS. 3 to 31.

This embodiment can provide a photo-coupling device with a reduced distance between the light receiving device and the light shading plate 6 and small reduction in S/N for the slit 5 as compared with Embodiments 1 to 3.

The photo-coupling device according to this embodiment should not be limited to the structure as described above. For example, as seen from FIG. 16, the light shading plate 6 provided with the slit may have one end embedded in the holder 10 and the other end placed in a free state by insert molding or thermocompression bonding molding.

The holder 10 may have different color tones according to different types of apparatus in which the photo-coupling device is used.

As in Embodiment 3, engagement means 61 for preventing the holder 10 from coming off, in the direction M of the rear of the case 3, from the case 3 is attached to the holder 10 so as to be engaged with the case 3. Further, a concave portion 62 (FIGS. 21, 24) for preventing the light emitting section 1 or light receiving section 2 coming off, in the direction M of extracting the lead frame 32 from the holder 10 is provided so as to fit in the light emitting section 1 or light receiving section 2 on the surface where the holder 10 is kept in contact with the light emitting section 1 or the light receiving section 2.

As understood from the description about Embodiments 1 to 4, the present invention can provide the following advantages.

(1) The holder provided with the light shading plate having the slit is arranged between the light receiving section and the light-gathering window, and the positioning means for positioning the holder with the aid of the contact of the holder with the case is attached to the case. Thus, unlike the prior art, there is no need of bonding the slit with high resolution and high positioning accuracy to the case using the bonding agent. As a result, the working time can be shortened and the attaching state of the light shading plate for each product can be made uniform.

(2) With respect to the light shading plate having the slit, by the insert molding or thermocompression bonding molding, its one end is fixed to the holder in the form embedded therein whereas the other end is placed in a free state. Thus, application of external force such as shock will not cause the light shading plate to come off. Hence, when an environmental temperature changes, stress which is generated owing to difference in the thermal changing amount such as expansion and contraction between resin and metal will not be applied to the above other end. As a result, the light shading plate is difficult to warp.

As a result, there can be provided a photo-coupling device which permits the slit to be incorporated with high resolution with high accuracy and at low cost and permits the light shading plate to be attached with high strength.

(3) Applying different color tones to the holder permits the specifications of the photo-coupling device products to be easily distinguished from each other.

(4) Since the bonding agent for fixing the light receiving section or light emitting section can be eliminated, the effort of removing the bonding agent and of bonding can be omitted.

I claim:

1. A photo-coupling device comprising:
    a light emitting section provided with a light emitting device;
    a light receiving section for receiving the light projected from the light emitting device of said light emitting section;
    an opaque case made for housing the light emitting section and the light receiving section opposed with respect to an object moving path intervening therebetween, said light emitting section and said light receiving section being provided with a light-projecting window and a light-gathering window on their opposite opaque case-wall-surfaces, respectively; and
    a light shading plate having a slit provided on one of opposite surfaces of the light-projecting window and the light-gathering window, further comprising:
    means for holding one of the light emitting section and the light receiving section, said means for holding being arranged between one of the light emitting section and the light-projecting window or between the light receiving section and the light-gathering window, said light shading plate being fixed to the holding means; and
    means, attached to said case, for positioning the holding means with respect to the case and with the aid of contact between the holding means and the case.

2. A photo-coupling device according to claim 1, wherein said light shading plate provided with the slit has one end fixed to the holding means and the other end placed in a free state by insert molding or thermocompression bonding molding.

3. A photo-coupling device according to claim 1, wherein said holding means has different color tones according to different types of apparatus in which the photo-coupling device is used.

4. A photo-coupling device according to claim 1, further comprising:
    engagement means, attached to said holding means so as to be engaged with the case, for preventing the holding means from coming off from the case; and
    a concave portion for preventing one of the light emitting section and the light receiving section coming off from the holding means, said concave portion being provided so as to fit in one of the light emitting section and light receiving section on a surface where the holding means is kept in contact with one of the light emitting section and the light receiving section.

5. A photo-coupling device comprising a light emitting section provided with a light emitting device, a light receiving section provided for receiving the light projected from the light emitting device, a light opaque case for housing the light emitting section and the light receiving section opposed with respect to an object moving path intervening therebetween, said light emitting section and said light receiving section being provided with a light-projecting window and a light-gathering window on their opposite opaque case-wall-surfaces, respectively, a light shading plate having a slit provided on the surface of the light-gathering window, means for holding one of the light emitting section and the light receiving section arranged, respectively, between the light emitting section and the light-projecting window or between the light receiving section and the light-gathering window, said light shading plate being fixed to said holding means, and means for positioning the holding means with the aid of contact of the holding means with the case, wherein said holding means holds said light emitting section, said light receiving section and said light shading plate by integral molding.

6. A photo-coupling device according to claim 5, wherein said light shading plate provided with the slit has one end fixed to the holding means and the other end placed in a free state by insert molding or thermocompression bonding molding.

7. A photo-coupling device according to claim 5, wherein said holding means has different color tones according to different types of apparatus in which the photo-coupling device is used.

8. A photo-coupling device according to claim 5, further comprising:

engagement means, attached to said holding means so as to be engaged with the case, for preventing the holding means from coming off from the case; and a concave portion for preventing one of the light emitting section and light receiving section coming off from the holding means, said concave portion being provided so as to fit in one of the light emitting section and light receiving section on the surface where the holding means is kept in contact with one of the light emitting section and the light receiving section.

* * * * *